United States Patent [19]

Feldman

[11] 4,117,400

[45] Sep. 26, 1978

[54] CIRCUIT FOR TESTING TRANSISTORS OR THE LIKE

[75] Inventor: Harold Feldman, Skokie, Ill.

[73] Assignee: Dynascan Corporation, Chicago, Ill.

[21] Appl. No.: 681,487

[22] Filed: Apr. 29, 1976

[51] Int. Cl.$^2$ ............................................. G01R 31/26
[52] U.S. Cl. ............................... 324/158 T; 324/73 R
[58] Field of Search ............. 324/158 T, 158 D, 73 R

[56] References Cited

U.S. PATENT DOCUMENTS

| 3,458,814 | 7/1969 | Ryan | 324/158 D |
| 3,636,450 | 1/1972 | Griffin | 324/158 T |
| 3,870,953 | 3/1975 | Boatman et al. | 324/73 R |

OTHER PUBLICATIONS

"TF30–Super Cricket" Service Manual; Sencore, 3200 Sencore Drive, Sioux Falls, S.D. 57107; 2-21-75.

Primary Examiner—Rudolph V. Rolinec
Assistant Examiner—Ernest F. Karlsen
Attorney, Agent, or Firm—Wallenstein, Spangenberg, Hattis & Strampel

[57] ABSTRACT

The circuit includes sources of periodic, low duty cycle, load terminal energizing and control terminal driving pulse waveforms. During each cycle, the waveforms occur only during successive test intervals occupying only a small portion of each cycle. During each test interval a load terminal energizing pulse is generated to energize a transistor or FET device of a different conductivity type and a control terminal drive voltage is penetrated which initially is of a polarity which would render a transistor or FET device of the associated conductivity type non-conductive, and then switches to a voltage of opposite polarity to render such device fully conductive. There is provided means for selectively varying the control terminal driving current which flows in an operating device from a relatively high to a relatively low level. Signals are derived showing the transition in the conductive states of the devices under test during the polarity transition of the control terminal drive voltage waveform. A first detecting and storage circuit is provided which detects and stores the occurrence of a current transition during the first test interval showing a possibly properly operating device of one conductivity type, and a second detecting and storage circuit is provided which detects and stores the occurrences of a current transition during the second test interval showing a possibly properly operating device of the opposite conductivity type. The storage circuit sets a leakage and material type test voltage producing circuit to produce a test voltage of proper polarity, depending upon whether the possibly properly operating device is of one or the other conductivity type.

18 Claims, 8 Drawing Figures

CIRCUIT FOR TESTING TRANSISTORS OR THE LIKE

BACKGROUND OF INVENTION

This invention relates to circuits for testing transistors or FET devices for satisfactory gain both in-circuit and out-of-circuit.

Until the recent development of improved testing apparatus, transistor devices could not be tested reliably and safely without disconnecting them from the circuits in which they are used. When testing transistors in-circuit, with most prior art testing apparatus there was a significant risk of damaging the circuits involved, particularly where the transistors were shunted with low impedences. Thus, if DC voltages or continuous square wave voltages are applied to a heavily shunted transistor, the resulting energy supplied to those circuits could be excessive and destroy associated circuit components.

In recent years there was developed a transistor testing circuit using pulsed test voltage waveforms with a low duty cycle which permits transistors to be tested safely in-circuit. Such a testing circuit is disclosed and claimed in U.S. Pat. No. 3,870,953 to Boatman, et al. In this circuit, square-topped pulse waveforms are provided for both the emitter-collector (load) terminals and the base (control) terminals of the transistor devices to be tested which automatically periodically establish the voltage conditions during successive testing intervals which test respectively NPN and PNP type transistors. These emitter-collector and base drive voltages are intermittently applied so that insufficient energy is applied to the transistors tested in-circuit to damage the transistors or the associated circuit components, even when low shunting impedances are present.

This transistor testing apparatus, however, did not provide for the testing of FET devices, and in other respects did not give the operator maximum aid in carrying out leakage and material type tests, or enable the operator to select different control terminal drive levels, as in the case of the present invention to be described, which has unexpected advantages to be described.

The present invention, therefore, represents an improvement over the testing apparatus which is the subject of said U.S. Pat. No. 3,870,953.

Accordingly, one of the objects of the invention is to provide improved transistor testing apparatus operating on the principle of that disclosed in said U.S. Pat. No. 3,870,953, and which further permits the use of such apparatus in the testing of FET devices.

Another object of the invention is to provide transistor and FET testing apparatus as described which gives the operator greater flexibility in his testing of the devices involved. A related object of the invention is to provide transistor and FET testing apparatus which makes it simpler for the operator to carry out material type and leakage tests where the initial testing of the devices raises the question as to whether or not the devices have excessive leakage.

SUMMARY OF THE INVENTION

In accordance with one of the features of the present invention, there is preferably provided a selection of at least two widely different control terminal drive levels for the test circuit. As in the case also with the commercial form of the test apparatus disclosed in said U.S. Pat. No. 3,870,953, a manually operable six-position test switch is preferably provided which can connect the load and control terminal energizing and drive voltage pulses to the three terminals of a transistor or FET under test in all the different possible connection combinations thereof, so that the operator does not have to identify the various terminals of the transistor or FET device to carry out the test. The low control terminal drive level is selected so that with most non-bipolar transistors a properly conducting transistor with a modest forward conduction current gain, for example, as low or about 20 to 30, and shunted by a not unusually low impedance, would test satisfactorily in only one of the six different possible test switch positions. A very marginal transistor which would pass a high level test designed to test transistors in highly shunted circuits can, therefore, be detected and discarded if it is found defective. Also, since most transistors will pass the low level test in only one test switch position, by color coding the leads extending from the test circuit to the transducer under test and providing an indication to the operator correlating the lead colors with the test switch position, all of the transistor terminals can be identified. (In some rare cases, high-frequency transistors or transistors with higher than usual gain levels may test out satisfactorily in two low level drive test switch positions where the transistor has sufficient gain in both possible directions of conduction thereof, as in the case of symmetrical bipolar devices like FET devices.)

The high control terminal drive level is selected so that maximum sensitivity is achieved for testing highly shunted in-circuit transistors. However under such condition unsymmetrical bipolar transistors (i.e. transistors having substantially different current gain in the two possible directions of current flow) having a satisfactory circuit gain will test good for two of the six possible connections of the test switch under modestly low shunting conditions, because most transistors under these conditions will then have sufficient forward and reverse gain to test out satisfactorily for forward and reverse directions of current flow therethrough. Since most good transistors will test satisfactory in only one test switch position during the low drive test, lead identification can be obtained under most test conditions, leaving the high amplitude level test for testing under the most severe in-circuit shunting conditions.

FET devices can be tested in either the low or high drive modes of operation of the present invention. However, only a FET device with an unusually high gain will test good under a low drive test. Therefore, to insure a valid test for all FET devices, the high drive mode of operation of the present invention should be initially used when the device being tested is known to be a FET device.

In accordance with another aspect of the present invention, the base drive waveforms utilized in the commercial form of the Boatman circuit disclosed in said U.S. Pat. No. 3,870,953 are modified so that FET devices can be reliably tested. The base drive pulse waveforms of the Boatman et al. circuit comprises a pulse of a given polarity which starts from zero at the beginning of the test interval for each transistor type and drops to zero after termination thereof. The zero level drive voltages cannot render FET devices non-conductive and so the current transition produced in a FET device by these waveforms do not produce current transitions which can be reliably detected. In accordance with the present invention, the control terminal drive waveforms produce current transitions in properly operating FET or transistor devices which can be reliably detected. These waveforms while initiating and terminating from and to zero volts vary between negative and positive polarities during the application of the positive and negative load terminal drive pulses. Such a drive signal waveform is also operable with transistor devices which are rendered non-conductive when only a zero voltage is applied to the base terminal thereof. Thus the same drive signal waveform is operable with both FET and transistor devices.

When a transistor does not show satisfactory conduction under the low base drive mode of operation of the present invention or a FET device does not show sufficient current gain under the high gate drive mode of operation of the present invention, the device is removed from the circuit and re-tested under the appropriate signal level conditions to determine whether or not the device involved tested unsatisfactorily because of high shunting impedance conditions or because of the defective operation of the transistor or FET device.

A transistor which tests good under an out-of-circuit condition but failed the test under the in-circuit condition can be further evaluated to determine whether the leakage thereof is excessive. In accordance with another aspect of the present invention, leakage tests (and also transistor material identification tests to determine whether the device is a germanium or silicon transistor which is necessary to perform a proper leakage test) can be carried out without the operator concerning himself about the selection of test voltages of proper polarity. In this aspect of the invention when a detection operation identifies under a high base drive condition a transistor of the PNP or NPN type having a satisfactory gain level but which did not test out properly under the low base drive test indicating a possibly leaky or heavily shunted transistor, a test circuit voltage or proper polarity is automatically set up to produce a test voltage of proper polarity for a leakage and material identification test for such a transistor after the transistor device is removed from the circuit.

The above described and other features of the invention and the advantages thereof will become apparent upon making reference to the specification to follow and the claims.

DESCRIPTION OF EXEMPLARY EMBODIMENT OF THE INVENTION

Figure 1:
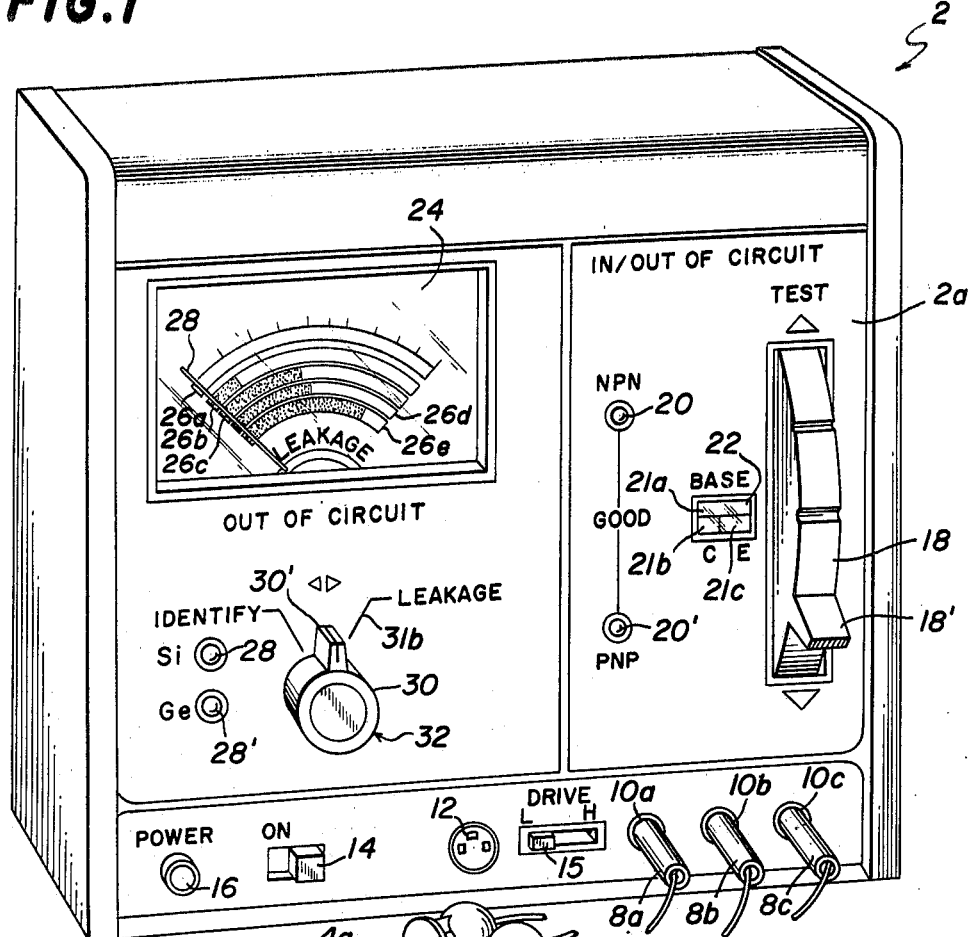
FIG. 1 is a perspective view of the control panel side of the housing of the testing apparatus of the most preferred form of the invention.

Referring now more particularly to FIG. 1, the testing apparatus shown therein includes a housing 2 in which all of the mechanical and electrical components to be described are housed, and as seen from the side thereof which includes the front control panel 2a. Extending from the bottom of the control panel are three differently colored connecting leads 4a, 4b, and 4c having conductive tips 6a, 6b and 6c adapted respectively to contact the unknown terminals of a transistor or FET device while it is still connected into its normal circuit. The leads have plug units 8a, 8b and 8c which are insertable within jacks 10a, 10b and 10c. When the test of a transistor or FET device in-circuit indicates the need for further testing, such device is physically removed from its circuit and the leads extending from such device are then inserted within the three apertures of socket 12. The control panel 2a also has projejcting therefrom the movable control arm of power on-off switch 14 and a lamp 16 which becomes lighted when the power on-off switch 14 is operated to its "on" position.

After power is turned on, generally the movable control arm of a drive level control switch 15 having a "LO" and a "HI" position is set to its "LO" position which establishes an amplitude level for load and control terminal drive current to flow in the load and control terminals of a transistor which will normally be adequate to produce a "good" transistor indication for only one conducting direction of most satisfactorily operating unsymmetrical bipolar transistors.

As is well known, a NPN transistor is normally operated from a source of DC voltage where the positive terminal thereof is generally coupled through a load circuit impedance to the collector terminal and the negative terminal thereof is connected directly or indirectly to the emitter terminal of the transistor. In a N channel FET device, a source of DC voltage is connected similarly to the drain and source terminals which are respectively equivalent to the collector and emitter terminals of a transistor. A NPN transistor or N channel FET device is normally operated in a conductive state by coupling a signal pulse or other current producing drive voltage source so that conventional current flows into the base or gate terminals, requiring generally that the signal sources be connected so that the positive terminal thereof is coupled to the base or gate electrode and the negative terminal thereof is connected to the emitter or source terminal of the transistor or FET device. A transistor is rendered non-conductive when the drive voltage applied between the base and emitter terminal is zero of of a current flow opposing polarity, whereas a FET device is rendered non-conductive by a drive voltage substantially different from zero and of a current opposing polarity.

The testing apparatus of the invention now being described is preferably one where the operator does not have to know beforehand the identity of the various terminals of the transistor or FET device involved. All that is necessary for the operator to perform a conduction test under low drive or high drive conditions is that, after connection of the leads 4a, 4b and 4c respectively to different terminals of the transistor or FET device involved, the operating arm 18' of a six position test switch 18 is moved successively to the different possible positions thereof until he hears a tone signal generated within the housing 2 which indicates that the transistor or FET device involved has appreciable amplification which at least under low drive conditions indicates a good transistor or FET device. When the operator hears such a tone signal, he looks upon the front panel 2a to see if a lamp 20 or 20' is lighted, which identifies whether the apparently good transistor or FET device being tested is a NPN or N channel device or a PNP or P channel device. As indicated, in some tests the transistor or FET device will test good in two different positions of the test switch 18, and in other tests it will test good in only one position of the test switch 18. Where the device tests good in only one position, the base, collector and emitter (or gate, drain or source) terminals of the device being tested will be identified by a color coded chart which appears in a window 22. The chart has three different sections 20a, 20b and 20c which indicate the color of the leads 4a, 4b and 4c which extend to the indicated terminals of the device involved.

Visible through a window 24 on the front panel 2a of the housing 2 are the various scales 26a, 26b, 26c, 26d, and 26e over which a pointer 28 of a meter movement (not shown) is moved.

If a transistor does not test good under low drive conditions, the control arm of the drive switch 15 is moved to the "HI" position where the amplitude of the control terminal drive signal is increased to make the test circuit more sensitive. If the test of the transistor or the FET device under high drive conditions indicates that a further test of the device is desirable, namely a leakage test, then the transistor or FET device involved is removed from the circuit and connected into the test apparatus through the socket terminals 12, as previously explained. If the operator does not know whether the device is a germanium or a silicon device, he must determine this before carrying out the leakage test. Thus, it will be noted that the leakage indicating scales 26b, 26c, 26d and 26e have segments marked thereon of different lengths, indicating the areas of the scales over which there is a satisfactorily low leakage condition for low signal and power transistors or FET devices (which have different normal leakage currents) and/or silicon and germanium devices which for a low signal or power device have different normal leakage currents. Indicia opposite the scale 26a indicates the actual leakage current flow.

If a transistor (unlike a FET device) does not test good under low drive conditions, this may be due to a defective transistor or because the transistor is so highly shunted that the transistor cannot be tested under such drive conditions. If the transistor tests good under such low drive conditions, then the transistor is unquestionably a good transistor. A transistor testing bad under the low drive conditions may test good under high drive conditions, but to be sure that the transistor is a satisfactory transistor for ideal circuit operating conditions the operator may wish to determine whether the transistor failed a low drive condition test because of excessive leakage or because merely that it was in a circuit having very low shunting impedances. If the transistor under test failed both the low and the high drive test, or if the transistor failed the low drive test and passed the high drive test, the transistor should generally be further tested out-of-circuit. (This applies also to FET devices which do not test good under the high drive conditions.) The transistor or FET device to be further tested is then removed from the circuit involved and its terminals inserted within the sockets of the connector 12 at the bottom of the control panel 2a. If the transistor or FET device involved did not test good under the high drive in-circuit test, then the operator will determine whether the transistor or FET device has a satisfactory gain under out-of-circuit conditions by moving the test switch 18 to its various positions to see if the lamp 20 or 20' will become energized. If a lamp does not become energized, the operator is fairly certain that the transistor is defective and he can then dispose of the same. However, if the transistor or FET device under test out-of-circuit results in the energization of one of the lamps 20 or 20', then he will generally carry out further tests as indicated to see whether the device tested poorly in-circuit because of very low shunting impedances or because of excessive leakage after he has determined whether the device is a silicon or a germanium semiconductor device.

To this end, knob 30 of a function control switch 32 spring-urged into a center position is moved against the return spring pressure so that a projecting nose portion 30' thereof is moved opposite a reference line 31a leading to the word "IDENTIFY". If the device involved is a silicon device, a lamp 28 will become energized and if it is a germanium device a lamp 28' will become energized. Indicia "Si" and "Ge" opposite the lamps 28 and 28' indicate the type of semi-conductor material which the energization of the adjacent lamps 28 and 28' are respectively to indicate. Next, the knob 30 is rotated to an opposite extreme position where the nose portion 30' thereof is opposite a reference line 31b leading to the word "LEAKAGE". If the device is a power device, the operator then examines a scale 26d or 26e associated with the particular type of semi-conductor material out of which the device being tested is made, namely a silicon or germanium semi-conductor material. (Indicia, not shown, positioned on or opposite the scales involved will identify the particular type of device involved for which the scale is to give leakage information.) If the device being tested is a low signal device, then the scale 26b or 26c associated with the particular semi-conductor material involved is examined to determine whether or not there is excessive leakage in the device under test. If the pointer 28 moves beyond the usually dark colored segment of the scale involved indicating satisfactory leakage, the operator knows that the transistor or FET device has excessive leakage. The actual amount of leakage current flowing therein can be seen by noting the indicia, not shown, opposite the first scale 26a.

A transistor testing device operating in the manner described is a unique test instrument since, heretofore, there has never been a single test instrument which can test transistors or FET devices in-circuit as well as out-of-circuit and where there is a selection of drive levels which, during an in-circuit low drive test with common levels of shunting impedances, indicates a properly operating transistor in only one of the six different possible connections of the load and control voltage terminal sources to the unknown terminals of the transistor involved, and during an in-circuit high drive test generally indicates a properly operating transistor or FET device for unusually low shunting impedance without any danger of damaging the circuit. Most transistors will test good in two of the six test switch positions in the high drive test. Moreover, the test apparatus just described is unique in that the operator does not have to concern himself in the materials determination of leakage tests with the conductivity type of the device involved since the selection of a proper polarity test voltage is done automatically by the test circuit described.

Figure 3:
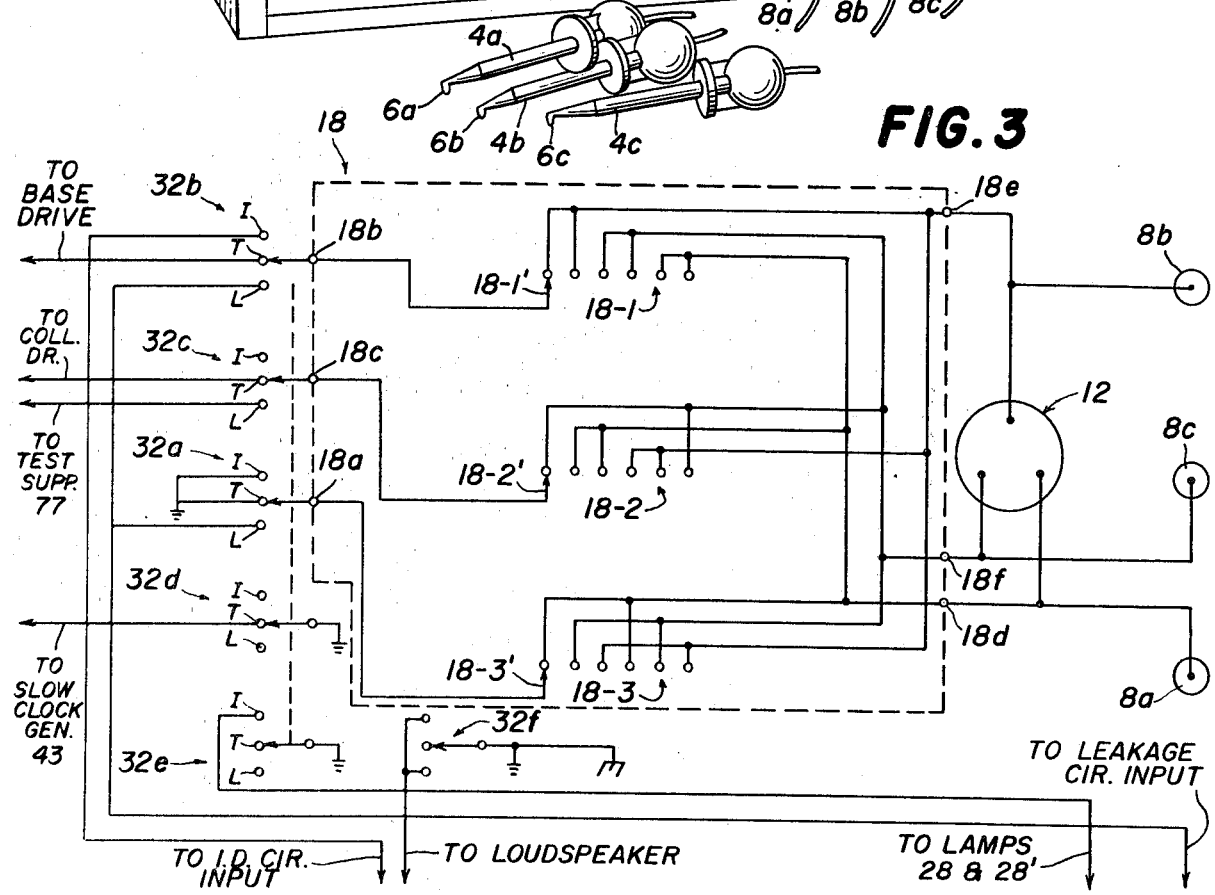
FIG. 3 is a circuit diagram of that part of the test circuit including the transistor terminal switch means and the associated function switch associated therewith.
Figure 2:
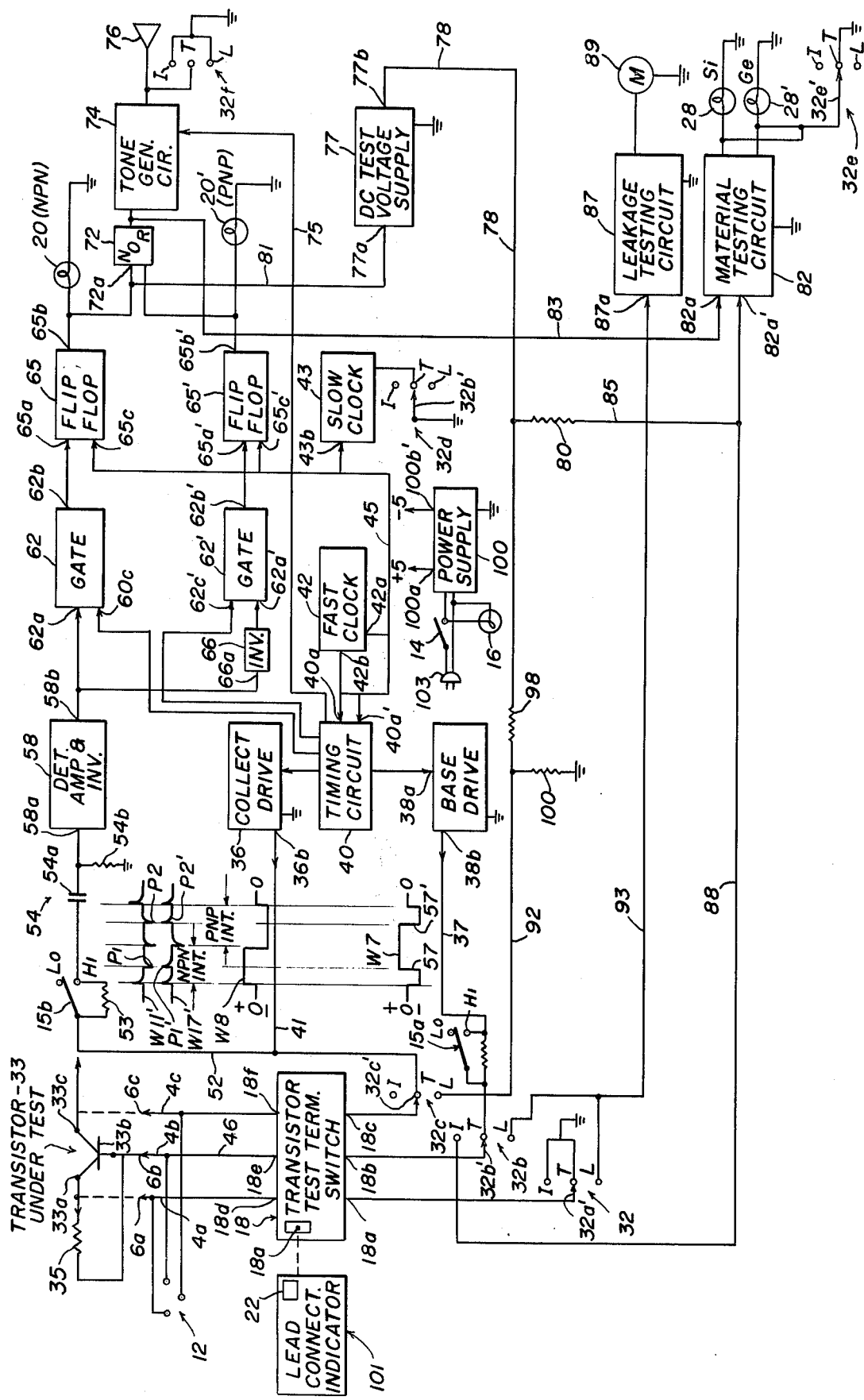
FIG. 2 is a basic block diagram of the basic components of the testing apparatus of FIG. 1.

Reference should now be to FIG. 2 which shows a detailed block and partial circuit diagram of the most preferred form of the present invention. FIG. 2 shows a transistor 33 connected in-circuit with a circuit impedance 35 between the base terminal 33b of the transistor and one of the load terminals 33a, which will be assumed to be the emitter terminal of the transistor. (However, it is assumed that the operator of the testing apparatus of the invention does not know what particular terminals of the transistor are the emitter, base or collector terminals.) The test switch 18, which is shown in block form in FIG. 2, has three switch sections 18-1, 18-2, and 18-3 as shown in FIG. 3, with input terminals 18a, 18b, and 18c respectively extending through conductors 29a, 29b, and 29c to the wipers 32a', 32b', and 32c' of the sections 32a, 32b, and 32c of the function control switch 32. The wipers of each of these function control switch sections can selectively engage "I", "T", or "L" terminals (respectively suggesting the words "Identify", "Test", and "Leakage"). The "I" and "T" terminals of the function control switch section 32a are shown grounded, and the "T" terminal of the function control switch section 32b is shown coupled through a resistor 39 to a conductor 37 extending to the output 38b of a base drive circuit 38. The resistor 39 is shunted by the section 15a of the drive control switch 15 when the switch is in its "HI" position.

The base drive circuit 38 has an input 38a controlled by a timing circuit 40 so that there appears at the output 38b a base terminal drive voltage waveform W7 which is negative during the first half of an NPN (or N channel) device test interval and is positive during the second half of this test interval, and which is positive during the first half of the immediately successive PNP (or P channel) device test interval and is negative during the second half of this test interval. These two successive test intervals are repeated each cycle of operation of the circuit shown, which cycle repeats itself at a given rate where the period occupied by the two test intervals described is a small fraction of the total period, referred to as a rescan period in FIGS. 5 and 7, between the successive generation of waveform W7. This provides a low duty cycle and relatively low energy applied to the transistor or FET device under test to avoid damage to the circuit in which the transistor or FET device is located. It is apparent that when the drive control switch 15 is respectively in its "LO" and "HI" positions, the current resulting from the waveform W7 will have relatively high and relatively low values.

The timing circuit is synchronized by a slow clock pulse generator 43 which generates pulses at a relatively slow frequency, for example, 10 hertz. Accordingly, the output 43b of the slow clock pulse generator 43 is shown connected by a conductor 45 to a synchronizing input 40a' of the timing circuit 40. The timing circuit 40 is also controlled by a fast clock pulse generator 42 which has an input 42a synchronized from the slow clock pulse generator 43, and an output 42b where pulses appear, for example, at a frequency of 1,000 hertz. The pulses are fed to the synchronizing input 40a of the timing circuit 40.

The timing circuit 40 also controls the voltage waveform generated by a collector drive circuit 36 having an output terminal 36b at which under no load conditions a waveform W8 appears which is positive only during the NPN test interval and is negative only during the PNP test interval. (Because of the voltage dropping effect of associated impedances, not shown, current flow in the device under test will modify the voltage appearing at output terminal 36b. The output 36b of the collector drive circuit 36 is coupled by a conductor 41 to the "T" contact of section 32c of the function control switch 32 where wiper 32c' is connected to the input 18c of the transistor terminal test switch 18. The "T" contact of the function control switch section 32a is grounded.

It should be apparent to those knowledgeable about the operation of transistors and FET devices that in the first half of the NPN test interval the polarities and timing of the waveforms W8 and W7 respectively generated by the collector drive and base drive circuits 36 and 38 are such that, during the NPN test interval if they were respectively coupled to the collector and base terminals of the NPN transistor or the source or drain and gate terminals of a N channel FET device, during the first half of this interval the device would be non-conductive and during the second half of this interval the device would be switched to a highly conductive state. Similarly, the collector drive and base drive waveforms W8 and W7 during the PNP test interval are such that a PNP transistor or a P channel FET device connected as described would be non-conductive during the first half of this interval and would be switched to a highly conductive state during the second half of this interval.

The test switch 18, as shown in FIG. 3, has three switch sections 18-1, 18-2, and 18-3 with associated wipers 18-1', 18-2', and 18-3' which make contact with six associated stationery contacts interconnected in such a way that the three inputs 18a, 18b, and 18c of the test switch 18 are connected in six different ways to output terminals 18d, 18e, and 18f thereof, whereby the collector and base drive waveforms are applied in the six different possible ways to the output terminals 18d, 18e, and 18f.

The output terminals 18d, 18e, and 18f of the test switch 18 connect respectively to the connecting leads 4a, 4b, and 4c and to the associated terminals of socket 12. The conductive tips 6a, 6b, and 6c associated with the leads 4a, 4b, and 4c are respectively connected to any of the exposed terminals of the transistor or FET device under test without the operator knowing beforehand which particular terminals are the load or control terminals of the device under test. The waveforms W7 and W8 are such that a transistor or FET device will not test good unless the input terminal 18b of the test switch 18 (which input terminal is connected as previously described to the output of the base drive circuit 38) is connected to the base or gate (control) terminal of the transistor or FET device under test. Also, in case of an unsymmetrical bipolar transistor, the input terminal 18c associated with the collector drive circuit 36 must be connected by the test switch to the collector terminal of the transistor under test for the transistor to test satisfactory under low drive conditions (except in the case of special transistors which have sufficient reverse gain to test satisfactory under such low drive conditions).

The point in the circuit just described at which the voltage conditions are sensed to determine whether or not the device being tested has a satisfactory gain is the output of the collector drive circuit 36 which should be coupled through the function control switch section 32c directly to one of the load terminals, generally the collector of an unsymmetrical bipolar transistor device under test, to obtain a good gain indication. When the output terminal 36b of the collector drive circuit is connected to the collector of a satisfactorily operating NPN transistor or either load terminal of a satisfactorily operating N channel FET device, as previously indicated because of the voltage dropping effect of various impedances connected to the output terminal 36b of the collector drive circuit, the voltage which appears thereat will be different from the collector drive waveform W8, namely that shown by the waveform W10 in FIG. 7. The waveform appearing at the output of the collector drive circuit 36 when a properly operating PNP transistor or P channel FET device is being tested is shown by the waveform W16 in FIG. 7. The voltage changes shown by these waveforms W10 and W16 will not occur when an improperly operating transistor or FET device is being tested and any pulses generated by the differentiation of such voltages will not be of sufficient amplitude to operate the detecting circuits in the manner now to be described when a properly operating transistor or FET device is being tested.

A conductor 52 extends from the collector drive output conductor 41 to the input portion of a detecting circuit which, as illustrated, includes a resistor 53 shunted by the section 15b of the drive control switch when this switch is in its "HI" position, so that the detector circuit then operates with maximum sensitivity under these conditions, to increase the signal to noise ratio therein. Resistor 53 is connected to a differentiating network 54 which differentiates the waveform appearing on the collector drive output conductor 41. When the waveforms W10 and W16 are differentiated by the network 54, comprising a capacitor 54 in series with a grounded resistor 56a, the voltage appearing across resistor 56a will be that shown respectively by the W11' and W17' waveforms shown only in FIG. 2. It should be noted that the pulses P1 and P1' occurring during the first polarity transition of the base drive waveform W7 are of opposite polarity respectively for properly operating NPN and PNP transistors (or their equivalent conductivity type FET devices), and that, similarly, the pulses P2 and P2' occurring respectively for properly operating NPN and PNP transistors (or their equivalent conductivity type FET devices), during the second polarity transition of the waveform W7 are also of opposite polarity. The circuits to be described, amplify and inverts the waveforms W11' and W17' and sense them only during the polarity transition periods of the waveform W7, to identify properly operating NPN or PNP devices (or FET devices of equivalent conductivity type).

Figure 7:
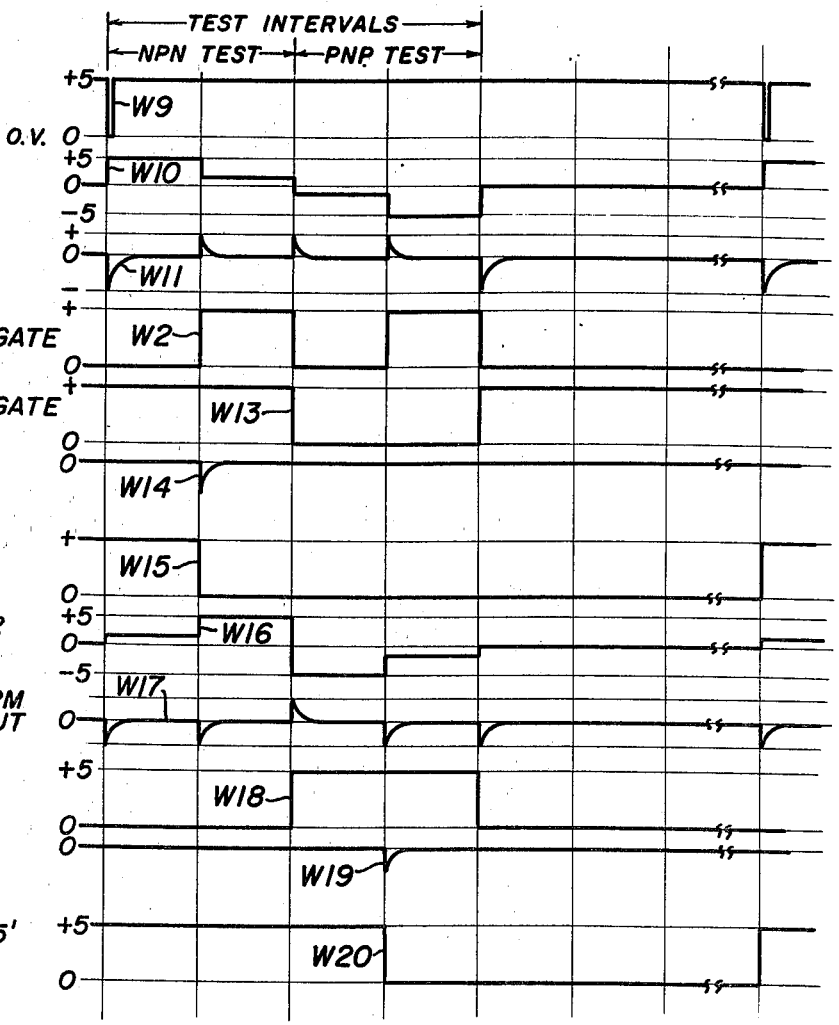
FIG. 7 shows various waveforms of signals present in the circuit of FIG. 6.

While this detecting circuit can accomplish this result in a number of ways, as illustrated in the preferred form of the invention of FIG. 2, the output of differentiating network 54 is shown connected to a detector amplifier inverter 58 (which may be an operational amplifier which inverts and amplifies waveforms W11' and W17' to produce the waveforms W11 and W17 in FIG. 7). This amplified and inverted output is fed to the input 62a of a gate 62 and also to the input 66a of an inverter 66. The output 66b of the inverter 66 is fed to the input 62a' of a gate 62'. The timing circuit 40 produces output signals fed to one or more input terminals of the gates 62 and 62', such as the inputs 60c and 60c' illustrated, which signals prepare the gate 62 for opening by a proper polarity (positive) pulse fed to the input 62a thereof only during the second half of the NPN test interval, and prepare the gate 62' for opening by a positive pulse fed to the input 62a' thereof only during the second half of the PNP test interval. While the gate 62 is prepared to be opened during the NPN test interval, the polarity of a pulse developed at the output of the detector amplifier and inverter 58 due to a properly operating PNP transistor or equivalent FET device will not open the gate 62. Similarly, during the time that the gate 62' is prepared for opening during the PNP test interval, the polarity of the pulse fed to the input 62a' thereof will be of the incorrect polarity to open the gate 62' when a properly operating NPN transistor or equivalent FET device is being tested.

The output terminals 62b and 62b' of the gates 62 and 62' are respectively connected to the input terminals 65a and 65a' of flip-flop circuits 65 and 65', which respectively are set by a positive pulse passing through the open gates 62 and 62'. The setting of either flip-flop 65 or 65' will energize the associated indicating lamps 20 or 20' which are shown connected to ground. Also, the setting of either flip-flop 65 or 65' will operate a tone generator circuit 64 in any suitable way. As illustrated, the output terminals 65b and 65b' of the flip-flop circuits 65 and 65' are respectively shown connected to a NOR gate 72 which will pass the voltage at the terminal 65b or 65b' of a set flip-flop 65 or 65', to energize a tone generator circuit 74 to which a loudspeaker 76 is converted. In the most preferred form of the invention, the tone generator circuit 74 is in condition for operation only during the intervals between the NPN and PNP test intervals. Accordingly, a control conductor 75 is shown extending between an output of the timing circuit 40 and the tone generator circuit 74, to couple a signal which prevents operation of the tone generator circuit 74 during the test intervals. Also, in the particular circuit shown in FIG. 2, a section 32f of the function control switch 32 is provided which prevents operation of the loudspeaker 76 when the function control switch 32 is in its "I" or "L" positions during the materials identification and leakage test operation of the testing circuit described. Accordingly, only the "I" and "L" contacts of this switch section are shown grounded.

The flip-flop circuits 65 and 65' are reset once during each cycle of operation of the described testing circuit (except where the function control switch is held in the "LEAKAGE" or "IDENTIFY" positions). To this end, connections are shown from the slow clock generator 43 to the rest inputs 65c and 65c' of the flip-flop circuits 65 and 65'.

It will be recalled that a material identification or leakage test is not carried out except where a transistor or FET device in an out-of-circuit test tests satisfactory, but failed either or both the low or high drive tests, indicating the possibility that the transistor or FET device involved has excessive leakage therein or that the transistor was located in a heavily shunted circuit. Thus, when such a transistor or FET device tests satisfactory in an out-of-circuit test, (or at any other time when the transistor tests satisfactory), a test voltage supply circuit 77 is automatically operated to provide at its output 77b a DC voltage of proper polarity to carry out a materials or leakage test for the NPN or N channel device or for the PNP or P channel device involved. Accordingly, the test voltage supply device 77 has an input 77a connected by conductor 81 to the output 65b of one of the flip-flop circuits 65. If either one of the lamps 20 or 20' is energized showing a properly operating transistor or FET device, the output of the flip-flop circuit 65, which will then be either a positive or a zero voltage, will identify whether the device involved is an NPN or N channel device (namely, when the output thereof is positive), or whether it is a PNP or P channel device (namely, when the output thereof is zero). The DC test voltage supply circuit 77 will provide a DC output 77b of one polarity when the output of the flip-flop circuit is positive and it will provide an output of the opposite polarity when the output of the flip-flop circuit 65 is zero.

During the performance of a materials or leakage test, it is imperative that the normal transistor test cycle be terminated and the set or reset condition of the flip-flop circuit 65 or 65' be maintained, so that the test voltage supply circuit 77 will have a steady output of proper polarity to carry out the materials and leakage tests. Accordingly, the slow clock pulse generator 43, which normally applicably resets the flip-flop circuits 65 and 65', is de-energized during these materials and leakage tests. To this end, FIG. 2 shows a function control switch section 32d having a grounded wiper 32b' and a connection extending only from the "T" contact to the slow clock pulse generator 43. Accordingly, the slow clock pulse generator 43 has no continuity to ground and therefore is decoupled from its supply source when the wiper 32b' is connected to the "L" and "I" contacts.

The materials testing circuit identified by reference number 82 in FIG. 2 has an enabling input terminal 82a connected by a conductor 83 to the output of NOR gate 72 so that the material testing circuit is prepared for operation only when either the flip-flop circuits 65 or 65' is set, indicating an apparently properly operating transistor or FET device. A conductor 78 extending from the output 77b of the test voltage supply circuit 77 is shown coupled through a resistor 80 and a conductor 85 to the input terminal 82a' of the material testing circuit 82. The input terminal 82a' of the material testing circuit is also shown connected by a conductor 88 to the "I" contact of the function control switch section 32b which contact, when a properly operating transistor has been detected, is connected through the wiper 32b' and the test switch 18 to the control terminal of the transistor or FET device being tested. The "I" contact of the function control switch section 32a is grounded so that the control terminal and one of the load terminals of the device under test during a materials test are connected between the input terminal 82a' of the material testing circuit 82 and ground. The testing circuit 82 to be described, is one wherein the circuit is responsive to the different voltage drops which occur between the terminals of the device under test when the devices are respectively silicon and germanium semiconductor devices. The circuit 82 energizes either the lamp 28 or 28', depending upon the value of this voltage drop. The lamps 28 and 28' are rendered inoperable except during the materials and leakage test by the connections thereof shown in FIG. 2 to the wiper 32c' of switch section 32e of the function control switch 32. Thus, the "I" and "L" contacts of this switch section have no connections thereto and the "T" contact thereof is grounded, so that these lamps are rendered inoperable except during a materials and leakage tests.

The output of the test voltage supply circuit 77 is also connected to a leakage testing circuit 87 which may be of conventional design. The leakage testing circuit 87 controls the operation of a meter movement 89. In a leakage test, one load terminal and the control terminal of the device under test are connected together and the leakage is measured between these terminals and the other load terminal thereof. To this end, the "L" contact of the function control switch sections 32a and 32b are respectively connected together by a conductor 91 and the conductor 91 is connected by conductor 93 to an input 87a of the leakage testing circuit 87. Thus, when the function control switch is moved to the "L" position thereof, the wipers 32a' and 32b' of the function control switch sections 32a and 32b will connect the conductor 93 to the control and one of the load terminals of the device under test. The other load terminal of the device under test is coupled by the test switch 18 to the wiper 32c' of the function control switch section 32c, in turn, coupled through the "L" contact of the switch section, a conductor 92, and resistor 98 of a voltage divider network including a grounded resistor 99 to the aforementioned conductor 78 extending to the output terminal 77b of the test voltage supply circuit 77. It is thus apparent that the output voltage of the test voltage supply circuit 77 is coupled in series with the two unconnected terminals of the device under test to the input of a leakage testing circuit 87 of conventional design which feeds a current through the meter movement 89 in proportion to the degree of leakage current involved. The test voltage supply output must have a definite polarity relationship with respect to the unconnected load and the base terminals of the device under test if the device is a non-bipolar transistor.

FIG. 2 shows a block 100 representing a DC power supply having an output 100a at which a +5 volt with respect to ground voltage appears and an output 100b at which a −5 volt with respect to ground voltage appears. Also shown is the aforementioned power on-off switch 14 and the power indicating lamp 16 connected in a conventional way to A.C. input conductors of a plug connector 103 thereshown.

FIG. 2 also shows in block form a lead connection indicator 101 which is mechanically coupled to the test switch 18. The lead connection indicator may comprise a movable member (not shown) which responds to the movement of the test switch 18 to its six different positions. In each of these different positions of the test switch 18, a different color coded chart having a different section 21a, 21b, and 21c becomes visible in the window 22 of the control panel 2a. The color of these three different sections visible in the window 22 corresponds to the colors of the leads 4a, 4b and 4c which would be extending respectively to the base collector and emitter of a non-bipolar transistor under test where the test circuit indicates that the transistor is a properly operating one for the particular test switch position involved.

Both the particular block diagram circuits shown in FIG. 2 and the particular details of any of the circuits shown in block form therein to be described can vary widely without deviating from the broad aspects of the invention. However, FIG. 2 shows the most preferred logic circuit of the invention and the circuits now to be described show the most preferred forms of the circuitry for some of the circuits shown in block form in FIG. 2. Accordingly, reference should now be made to FIG. 4 which, among other things, shows the preferred circuit for the timing circuit 40 and the collector and base drive circuit 36 and 38. The timing circuit 40 comprises a series of toggle flip-flop circuits F1, F2, and F3 which have enabled input terminals E and reset input terminals R to which positive voltage must be fed to enable the flip-flop circuit to be set and reset (i.e. toggled) by successive pulses fed to toggle input terminals T thereof from the input of the fast clock pulse generator 42. The output thereof, shown by waveform W9 in FIG. 5, is a normally +5 volt output which drops momentarily to zero volts at a 1000 Hertz rate. The reset input terminal R can also be used to reset the flip-flop circuits to a reference reset condition when a zero or negative going voltage is applied thereto. Each of these toggle flip-flop circuits have Q and Q' output terminals. The voltage at each Q output terminal will be positive when the flip-flop circuit involved is in a set condition and will be at zero voltage when the circuit is in a reset condition. The voltage at each Q' output terminal is opposite to that of the L output terminal (i.e. it is zero when the other is positive and vice versa).

The timing circuit further has a flip-flop circuit F5 having set and reset input terminals S and R respectively and output terminals Q and Q' and which will have the same voltages as the Q and Q' terminals of the toggle flip-flop circuits F1, F2 and F3 just described in the set and reset conditions states thereof. The feeding of a zero or negative going pulse to the set input terminal S will result in the setting of the flip-flop circuit F5 and the feeding of a similar voltage to the reset terminal R of the flip-flop circuit F5 will result in the resetting of the flip-flop circuit F5. The timing circuit further includes inverting "NAND" gates 102 and 102' having pairs of input terminals 102a–102b and 102a'–102b'. The output voltage of each gate 102 or 102' will be normally +5 volts and will drop to zero volts when both input terminals thereof have +5 volts voltage fed thereto.

The slow clock pulse generator 43 generates negative going pulses at an exemplary rate of 10 per second. As shown by waveform W1 in FIG. 5, the generator 43 normally has a +5 volt input which momentarily drops to zero at the 10 Hertz rate. These pulses are fed by a conductor 104 to the set input terminal S of the flip-flop circuit F5 which causes the voltage on the Q' output terminal thereof (see waveform W3' in FIG. 6) to drop from a positive to a zero voltage level which remains for the duration of the NPN and the PNP test intervals previously described. The voltage on the Q output terminal thereof (see waveform W3 in FIGS. 4 and 5) which is positive during the NPN and PNP test intervals is fed by conductors 113, 115, 118, 120 and 119 to the reset and enable terminals of toggle flip-flop includes F1, F2, and F3 to prepare them for operation. A conductor 105 extending from the Q' output terminal of flip-flop circuit F5 extends to the previously mentioned NOR gate 72 controlling the tone generator circuit 74.

The negative or zero going pulse output from the slow clock pulse generator 43 is fed by conductors 106 and 108 to the reset input terminal R of the toggle flip-flop circuit F1 to prevent this circuit from being set at that instant. The same pulse is fed through a rectifier 110 to a terminal 42b of the fast clock pulse generator to synchronize the same. In the particular circuit illustrated, the terminal 42b is also the output terminal for the pulses generated by the pulse generator 42. These pulses are fed to toggle input terminal T of the toggle flip-flop circuit F1. Accordingly, a conductor 111 extends from the terminal 42b to toggle input terminal T of the flip-flop circuit F1. Thus, the second pulse generated by the fast clock pulse generator 42 will toggle the flip-flop circuit F1 as does each succeeding pulse thereof, so long as the flip-flop circuit F1 receives a positive enabling voltage on its enable input terminal which lasts for the duration of the NPN and PNP test intervals. There is thus produced at the Q output of the toggle flip-flop circuit F1 a voltage waveform W2 (see FIG. 4 or FIG. 5) which is coupled by a conductor 121 to the toggle input terminal T of the toggle flip-flop circuit F3 and by a conductor 123 to the detector gates 62 and 62'. The positive going portions of the waveforms W2 occur during the second halves respectively, of the NPN and PNP test intervals, during which the pulses resulting from the differentiation of the collector terminal voltage waveforms like W10 and W16 are to be detected, to identify whether or not there is a satisfactory operating transistor or FET device.

It will be recalled that only a zero or negative going voltage will effect a setting operation in any of the flip-flop circuits just described and, therefore, a connection of the Q output of the toggle flip-flop circuit F1 to the toggle input terminal T of the toggle flip-flop circuit F3 will not result in a toggling of flip-flop circuit F3 except during the zero going portions of the waveform W2. Accordingly, the waveform appearing at the Q output terminal of the flip-flop circuit F3 will have the outline of waveform W5 of FIGS. 4 and 5, which is positive only during the PNP test interval. Waveform W5' is the waveform appearing at the Q' output terminal of the flip-flop circuit F3 and it is zero during this test interval.

Figure 4:
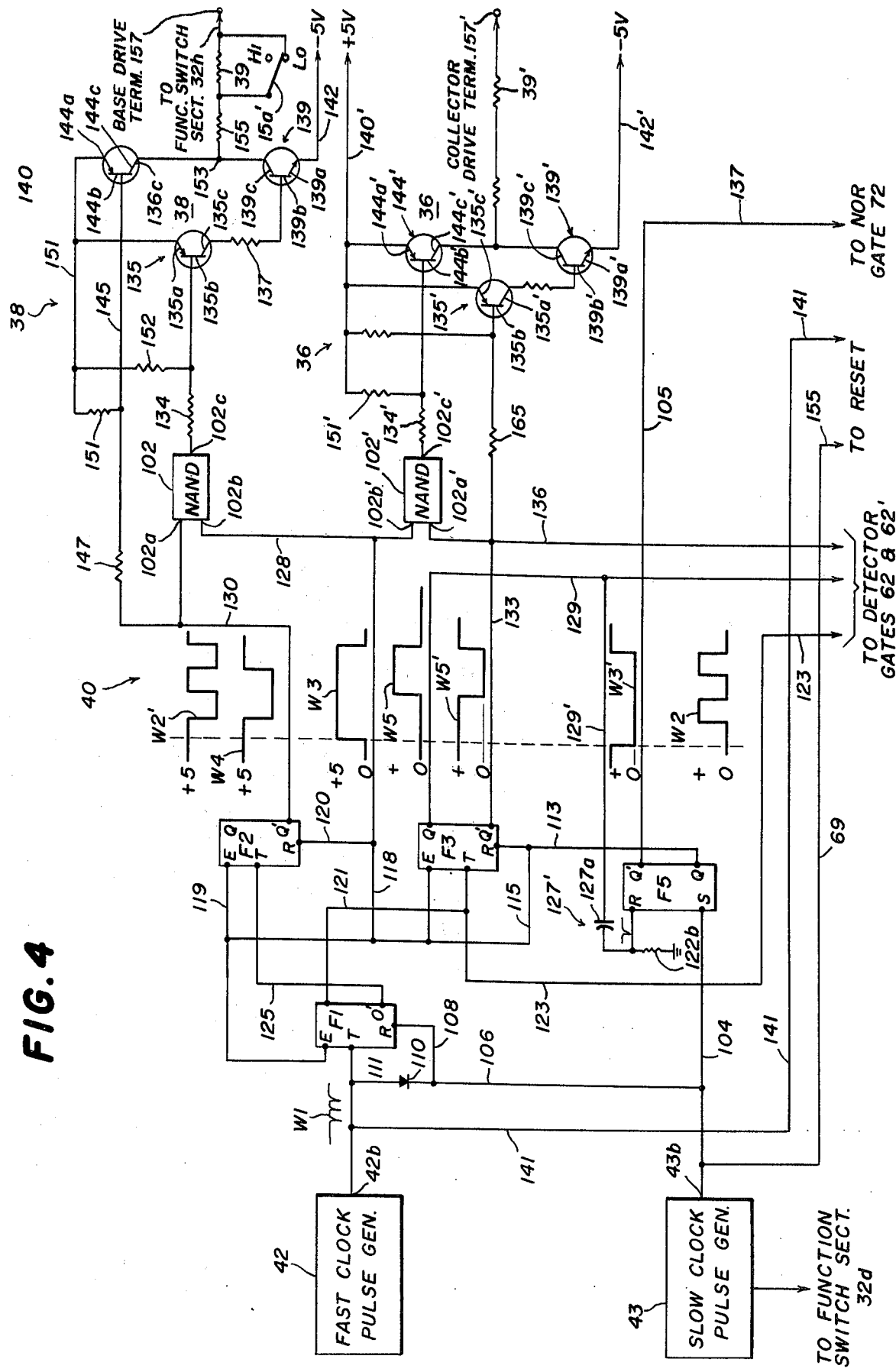
FIG. 4 is a detailed block and partial circuit diagram of the collector and base drive circuits and the timing circuits shown in block form in FIG. 2.
Figure 5:
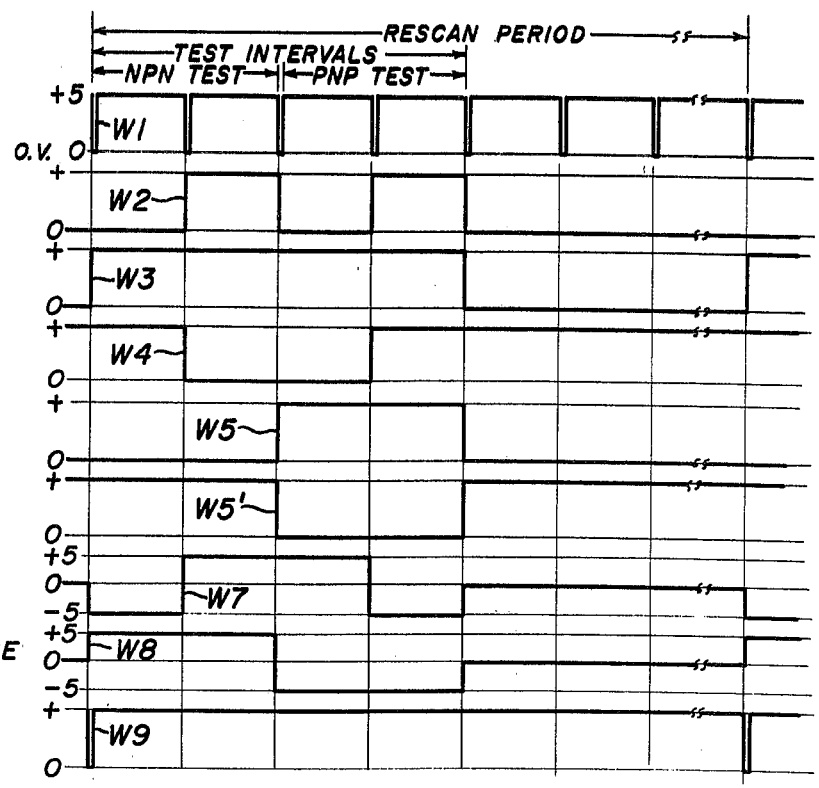
FIG. 5 shows various signal waveforms present in the circuit of FIG. 4.

A conductor 125 extends from the Q' output of the toggle flip-flop circuit F1 at which terminal the waveform W2' of FIG. 4 appears to the toggle input terminal T of flip-flop circuit F2. Since the toggle flip-flop circuit F2 is toggled only during a zero going pulse fed to the T input terminal thereof, the waveform W4 appears at the Q' output terminal thereof, which waveform is positive except during the second half of the NPN test interval and the first half of the PNP test interval. Thus the waveform W4 is a zero going pulse centered over the middle portion of the NPN and PNP test intervals. The waveform W3 which is positive during the duration of these test intervals, and the waveform W4 which is zero during a period centered within the test intervals are utilized to generate the base drive voltage waveform W7 shown in FIG. 5.

The waveform W3 generated by toggle flip-flop circuit F5 is fed by conductors 118 and 128 to the input 102b of a "NAND" gate 102 and the waveform W4 generated by toggle flip-flop circuit F2 are fed by conductors 130 and 132 to the input 120a of a "NAND" gate 102. The outputs 102c of "NAND" gate 102 is coupled through a resistor 134 to the base 135b of a PNP transistor 38 whose emitter 135a is connected to a +5 volt bus 140. The collector 135c of the transistor 135 is coupled through a resistor 137 to the base 139b of PNP transistor 139. The emitter 139a of the transistor 139 is connected to −5 volt bus 142. The collector 139c of the transistor 139 is coupled to the collector 144c of a PNP transistor 144 whose emitter 144a is connected to the +5 volt bus 140 and whose base 144b is connected by a conductor 145 and resistor 151 to the emitter 144a. A conductor 145 and a resistor 147 connects the base 144b to the conductor 130 upon which the waveform W4 appears.

It should be apparent that when the waveform W4, which varies between +5 volts and zero, is at +5 volts, the voltage difference between the emitter and the base of the transistor 144 is zero, since the emitter is connected to the +5 volt bus 140. Zero volts applied to the base of a PNP transistor results in termination of collector current. Transistor 144 becomes conductive when the waveform W4 drops to zero, which occurs during the second half of the NPN testing interval and the first half of PNP testing interval, since then the base 144b is negative with respect to the emitter 144a.

When the waveforms W4 and W3 are applied to the inputs 102a and 102b of the gate 102, prior to the beginning of the NPN test interval the voltage at the input 102a will be +5 volts and the voltage at the input terminal 102b will be zero volts, so that its output terminal 102c will be at +5 volts and the adjacent transistor 135 will be non-conductive. However, at the start of the NPN test interval and until the point where the waveform W4 reduces to zero, both inputs to the gate 102 will be positive, so that the gate output terminal 102c will drop to zero, thereby causing the transistor 135 to become conductive. This, in turn, drives the transistor 139 conductive to couple the −5 volt bus 142 to the collector circuit point 153' coupled by the resistor 155 and the previously mentioned resistor 39 to a base drive terminal 157 connected to the "T" contact of the function control switch section 32b.

As previously indicated, when the waveform W4 drops to zero, the "NAND" gate 102 will close, and this portion of the waveform W4 coupled through the resistor 147 to the base of transistor 144, will render this transistor conductive, thereby coupling the +5 volt bus 140 to the point 153' coupled to the base drive terminal 157. The transistor 144 remains conductive until the waveform W4 once again rises to a +5 volt level, when the aforementioned transistors 135 and 139 will become conductive for the second half of the PNP test interval, after which the dropping of the waveform W3 to zero will result in both transistors 144 and 139 being non-conductive, so that the voltage at the base drive terminal 157 will be zero.

The collector drive waveform W8 (FIG. 5) is generated by the feeding of the waveforms W3 and W5 of the Q and Q' outputs of the flip-flop circuits F5 and F3 to the inputs 102b' and 102a' of the "NAND" gate 102' through conductors 113, 115, 118, 128, and 133 and 136. The output terminal 102c' of this gate is coupled through a resistor 134' to the base 144b' of a PNP transistor 144' forming part of the collector drive circuit 36, which is a circuit similar to the base drive circuit 38 just described. The corresponding components of the circuits 36 and 38 will be similarly numbered, except that a prime (') has been added to the elements of the circuit 36. However, the connections of the gate 102' and other associated portions of the circuit to the collector drive circuit 36 are different from those connections made from the gate 102 and associated portions of the base drive circuit 38 to the transistors of the base drive circuit 38. Accordingly, the output terminal 102c' of the gate 102', which is normally at +5 volts, will normally render the transistor 144' non-conductive until the gate 102' has opened by the transition of the waveform W3 from zero to +5 volts at the beginning of an NPN test interval when the waveform W5' is still positive. The conduction of transistor 144' will thus cause +5 volts to appear at the collector drive terminal 157' adjacent to resistor 39'.

At the initiation of the PNP test interval, when the waveform W5' drops to zero, the gate 102' will re-close, to render the transistor 144' non-conductive, and the waveform W5', then dropping to zero, is effective to render the transistor 135 conductive, as this voltage is coupled through resistor 163 to the base 135b' of the transistor 135' driving transistor 139'. The transistor 135' is therefore conductive during this test interval during which the waveform W5' remains zero.

Figure 6:
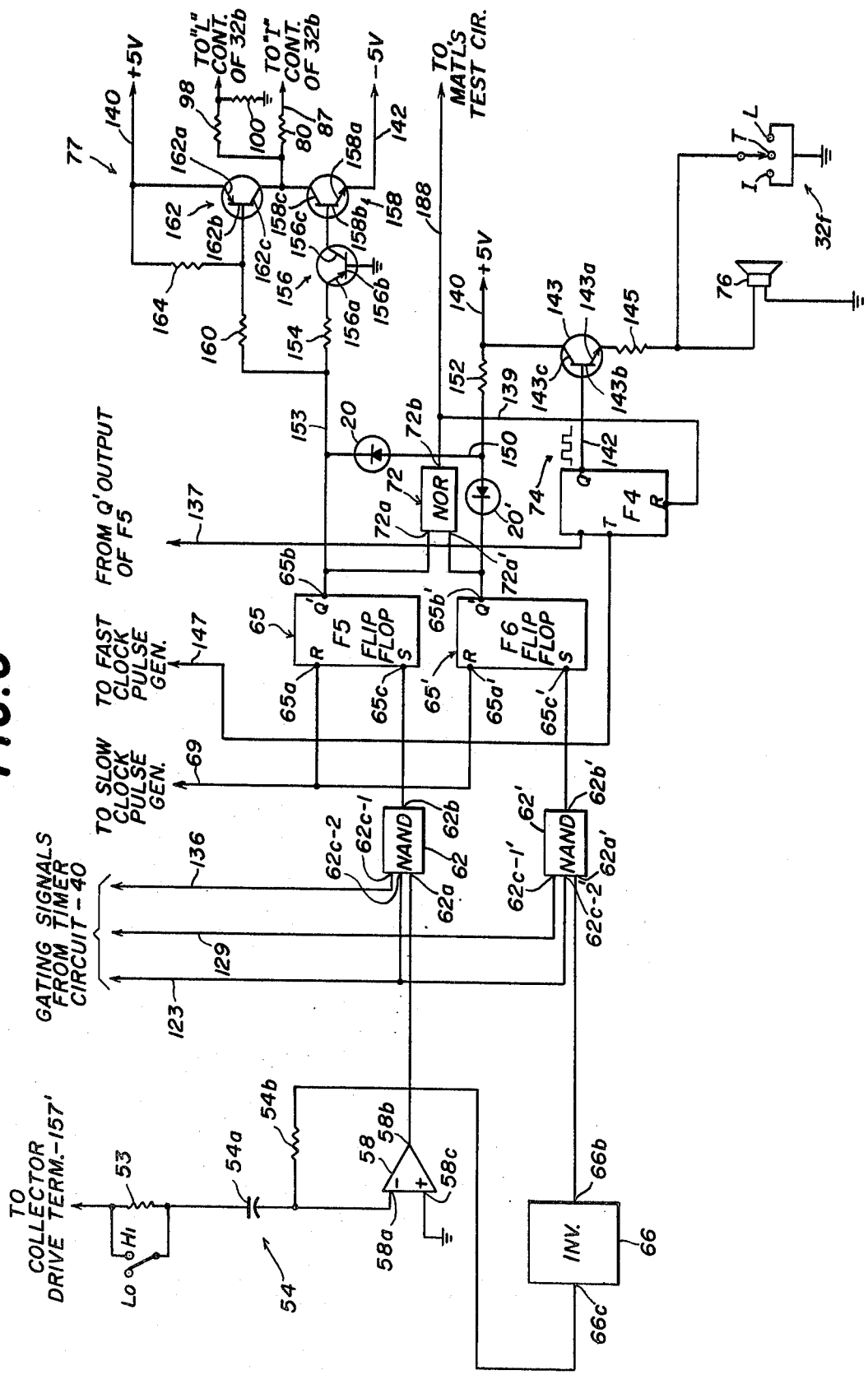
FIG. 6 is a detailed block diagram and partial circuit diagram of the detector amplifier, gate, flip-flop and tone control and generating circuits shown in block form in FIG. 2.

Refer now to FIG. 6 which shows, among other things, exemplary circuits for the detector amplifier and inverter circuit 58, inverter 66, gates 62 and 62', flip-flop circuits 65 and 65', NOR circuit 72 and the tone generator circuit 74 shown in block form in FIG. 2. FIG. 6 shows the detector amplifier and inverter 58 circuit as an operational amplifier with the negative inverting input terminal 58a thereof connected to the output terminal 58b of the amplifier through a resistor 54b, which also forms a part of the differentiating network including the capacitor 54a. The positive input terminal 58c of the operational amplifier is shown grounded. As previously described, the output of the operational amplifier 58b is coupled to the input 62a of the gate 62' which is a "NAND" gate. Similarly, the output 66b of the inverter 66, whose input 66a is connected to the output terminal 58b of the operational amplifier 58, is connected to the input 62a' of the gate 62' which is also a "NAND" gate. While in FIG. 2, the gates 62 and 62' are shown with only a single gating input (since this is a generalized or simplified circuit), the gate 62 of FIG. 6 has two gate signal input terminals 62c-1 and 62c-2 and the gate 62' has two gate signal input terminals 62c-1' and 62c-2'. The gate signal input terminals 62c-2 and 62c-2' of the gate 62 and 62' are connected to the conductor 123 previously described in connection with FIG. 4 on which conductor the waveform W2 appears which goes positive only during the second half of the NPN test interval and the second half of the PNP test interval, so that the gates 62 and 62' are prepared for opening during these periods. However, the gate 62 is prepared for opening only during NPN test interval by the connection of its gating signal input terminal 62c-1 to a conductor 136 upon which appears the waveform W5' which is always positive except during the PNP test interval when it is zero. The gate 62' is prepared for opening only during the PNP test interval by the connection of its gate signal input terminal 62c-1' to the conductor 129 upon which waveform W5 appears, which is only positive during the PNP test interval.

As previously indicated, only a properly operating NPN transistor results in the presence of a positive pulse at the output of the gate 62 during the polarity transition of the base drive waveform W7 from its negative to its positive polarity during the NPN test interval, and a properly operating PNP transistor results in a positive pulse at the output of gate 62' during the polarity transition of the base drive waveform W7 from its positive to its negative polarity during PNP test interval. The pulse at the output of gates 62 and 62' are fed to the set input terminals 65c and 65c' respectively of the flip-flop circuits 65 and 65'.

The output terminals 65b and 65b' of the flip-flop circuits 65 and 65' are Q' output terminals which have a +5 volt output when the flip-flop circuit involved are reset and a zero voltage when the flip-flop circuits are set. At the beginning of each NPN test interval, the reset input terminals 65a and 65a' of these gates are respectively fed with a zero going pulse from the slow clock pulse generator 43 to minimize any continued false operation due to occasional transients. The clock pulses are fed on conductor 69.

The Q' output terminals 65b and 65b' of the flip-flop circuits 65 and 65' are respectively coupled to the inputs 72a and 72a' of the "NOR" gate 72. "NOR" gate 72, as illustrated, is a circuit wherein the voltage at the output terminal 72b thereof is normally zero and will be positive if any one or more inputs thereof are at zero volts. If no transistor is being tested or the transistor being tested does not pass the gain test, the Q' outputs of the flip-flop circuits 65 and 65' will be positive.

When the NOR gate output is positive, the positive voltage is fed by a conductor 139 to the reset input terminal R of a toggle flip-flop circuit F4 like the other toggle flip-flop circuits F1, F2, and F3 previously described. To permit the flip-flop circuit F4 to toggle, both the enabling input terminal E and the reset terminal R must have a positive voltage thereon. To this end, the waveform W3' at the output of the flip-flop circuit F5 (FIG. 4) is coupled by a conductor 137 to the enabling terminal E of the flip-flop circuit F4. The waveform W3' is normally positive and goes zero only during the very short period occupied by the NPN and PNP test intervals (0.004 second) during each rescan period (0.1 second). The length of time that the enabling terminal of the flip-flop circuit receives this zero voltage from the line 137 is of very short duration and repeats at a low rate of 10 cycles per second but it modifies the sound generated by the loudspeaker 76 so that it is a more easily noticeable raspy sound. The toggling input terminal T of the flip-flop circuit F4 receives its input from the output of the fast clock pulse generator 42 on conductor 141. The zero going fast clock generator pulses are effective in repeatedly switching the toggle flip-flop circuit F4 between its set and reset states, while the enabling and reset terminals E and R thereof receive a positive voltage in the periods between the NPN and PNP test intervals. The flip-flop circuit F4 has a Q output which during the toggling of the circuit comprises positive pulses fed to the base 43b of a NPN transistor 143 by a conductor 142. The collector 143c of the transistor 143 is connected to the +5 volt bus 140 and the emitter 143a of the transistor 143 is connected through resistor 145 to the terminals of loudspeakers 76, in turn, connected to ground.

The lamps 20 and 20', which are shown as light-emitting diodes, are respectively connected between the Q' output terminals of the gates 65 and 65' and a common terminal 150 connected through a resistor 152 to the +5 volt bus 140. It is apparent, therefore, that when either of the Q' outputs of the flip-flop circuit 65 or 65' is zero because of the set condition thereof, the associated lamp 20 or 20' will become energized.

As previously indicated, when either the lamp 20 or 20' is energized indicating to the operator that there is a properly operating transistor or FET device and the operator desires to carry out a leakage test, the condition of the flip-flop circuit 65 will indicate whether the transistor or FET device under test is a NPN (or N channel) or a PNP (or P channel) device. Accordingly, a conductor 153 extends between the Q' output 65b of the flip-flop circuit 65 and a resistor 154, in turn, connected to the emitter 156a of a PNP transistor 156 of the test supply circuit 77. The base 156b of transistor 156 is grounded and the collector 156c thereof is connected to the base 158b of a NPN transistor 158. The emitter 158a of transistor 158 is connected to the −5 volt bus 142 and the collector 158c thereof is connected to the collector 162c of a PNP transistor 162. The base 162b of the transistor 162 is connected through the resistor 160 to the flip-flop circuit output conductor 153 and through a resistor 164 connected to the emitter 162a of the transistor 162, in turn, connected to the +5 volt bus 140.

Accordingly, when the Q' output of the flip-flop circuit 65 is at zero volts, indicating a satisfactorily operating NPN transistor under test, this zero voltage coupled through resistor 160 to the NPN transistor 162 will render the transistor 162 conductive, to couple the voltage of the +5 volt bus 140 to the collector side of the transistor 162, in turn, connected through the resistor 80 to the conductor 88 (FIG. 2) leading to the "I" contact of the sections 32b of the function control switch 32. The collector side of the transistor 162 is also connected through the resistor 98 to the "L" contact of the section 32b of the function control switch, which forms part of the leakage test circuit as previously explained.

When the Q' output terminal of the flip-flop circuit 65 is positive, indicating an apparently satisfactorily operating PNP transistor, this positive voltage effects conduction of the base grounded transistor 156 which, in turn, renders the transistor 158 conductive to couple the −5 volt bus 142 to the collector side of the transistor 158 and through the resistor 80 and 98 to the circuits which perform the material and leakage tests. (As previously indicated, the state of flip-flop circuit 65 is locked-in when the function control switch 32 is moved from its center position to either the "I" or "L" positions thereof.)

Figure 8:
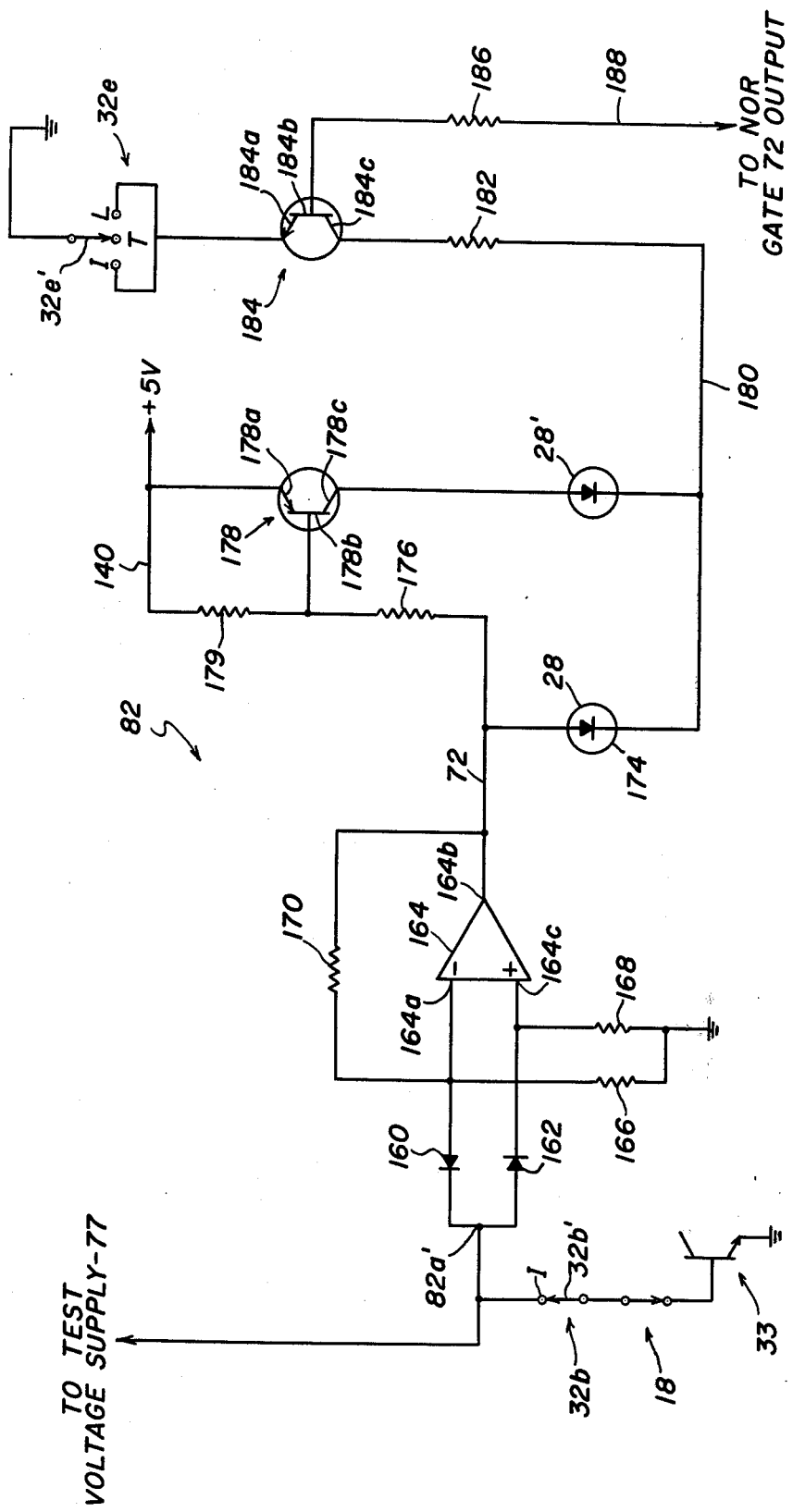
FIG. 8 is a circuit diagram of the material identification circuit shown in block form in FIG. 2.

Reference should now be made to FIG. 8 which shows a preferred but exemplary circuit for the material testing circuit 82. It will be recalled that the input terminal 82a' of this circuit is coupled through conductors 88 and 85, and resistor 80 to conductor 78 leading to the output terminal 77b of this test voltage supply 77. Also, the function control switch section 32b when its wiper 32b' engages the "I" contact connects one of the load terminals and the control terminal of the device under test between the input terminal 82a' of the material testing circuit 82 and ground. Moreover, the polarity of the DC voltage fed to the input terminal 82a' depends upon whether the device under test is of one conductivity type or another since the voltage drop which is measured in the materials test to determine whether the material is a silicon or germanium material must be that produced by current flow in the low impedance direction of the control terminal to load terminal junction.

The material testing circuit 82 includes reverse connected rectifiers 160 and 162 respectively connected between the input terminal 82a' and the respective inverting and non-inverting input terminals 164a and 164a' of an operational amplifier 164. A feedback resistor 170 is connected between the output terminal 164b and the inverting input terminal 164a. For an NPN or N channel device the voltage drop between the control and load terminal is positive and for a PNP or P channel device this voltage drop is negative. If the negative voltage drop is greater than −0.4 volts, which is present for a silicon device, this voltage exceeds the threshold of the rectifier 160, which is a silicon recitifier with a reverse threshold of 0.4 volts. This negative voltage is applied to the input terminal 164a of the operational amplifier 164 to produce a +5 voltage at the output terminal 164b thereof. If the base to emitter voltage involved exceeds +0.4 volts, which is indicative of a silicon device of opposite conductivity type to the device which produced a voltage in excess of 0.4 volts, this voltage is coupled through the rectifier 162, which is also a silicon rectifier, to the input terminal 164a' of the operational amplifier which then produces +5 volts at the output terminal 164b thereof. When neither of the input terminals 164a or 164a' receives a voltage through the rectifier 160 or 162, the output of the operational amplifier will be at zero volts. This occurs when the device under test is a germanium device which produces a control to load terminal voltage drop of less than 0.4 volts.

When the voltage at the output terminal 164b is +5 volts, this voltage is applied to one of the terminals of the light emitting diode or lamp 28, in turn, connected through resistor 182 and the collector 184c and emitter 184a of an NPN transistor 184 to the "I" and "L" terminals of the section 32e of the function control switch 32. The switch section 32e has a wiper 32e' which is grounded. The transistor 184 is maintained in a non-conductive state until the NOR gate 72 has a positive output indicating that the device being tested is an apparently properly operating transistor or FET device. Accordingly, a conductor 188 connected to this NOR gate extends to a resistor 186 connected to the base 184b of the transistor 184.

The +5 volts at the output terminal 164b of the operational amplifier 164 is connected through a resistor 176 to the base 178b of PNP transistor 178 whose emitter 178a is connected to the +5 volts bus 140 and also through resistor 179 to the base 178b. Thus, under the +5 volts output conditions of the amplifier 164, transistor 178 is non-conductive.

When the device under test is a germanium device, and the output of the operational amplifier 164 is zero volts, this will render the transistor 178 conductive, provided the collector circuit of this transistor has continuity. Accordingly, the collector 178c is coupled through the light emitting diode or lamp 28' to the conductor 180 extending to the resistor 182 in series with the collector of transistor 184. It can thus be seen that when the wiper 32e' is advanced to the "I" or the "L" contact and an apparently satisfactorily operating transistor is being tested so that the base 184b of transistor 184 has a positive voltage applied thereto, current flows through the lamp 28' through a circuit including the load terminals of the transistors 184 and 178. Since the voltage on conductor 180 is then near ground potential, the lamp 28 to which the conductor 180 extends will have substantially no voltage applied to the opposite terminals thereof, and so it is in a de-energized state.

While the specifications for the testing circuit just described may vary widely, in its commercial form it has the following specifications:

| Applied test current: | |
|---|---|
| base drive: | 250 mA (high drive) or 1 mA (low drive) at 4% duty cycle, |
| collector drive: | 125 mA at 4% duty cycle, |
| test repitition rate: | 10 per second, |
| reverse voltage for leakage test: | 2.0V. |
| Limiting in-circuit shunt values for valid good-bad test: | |
| shunt resistance: | down to 10 ohms with high drive, down to 1.5K ohms with low drive, |
| capacitance: | up to 15 mfd with high drive, up to .3 mfd with low drive. |

The shunt resistance and capacitance referred to are the net resistance or capacitance measured between the control and reference load terminal of the test device in the circuit in which the device is located. Since the test circuit of the invention is utilized to test transistor devices or the like of various power handling capabilities, a given applied collector or base drive voltage could produce different current transitions unless collector and base drive circuits 36 and 38 act as constant current sources when the devices being tested are operating in their normal manner. Accordingly, the circuit impedance provided by the collector and base drive circuits 36 and 38 are selected to be so much greater than the forward junction impedances of the test devices so that when the voltages applied thereto are of proper polarity the desired above preferred currents will flow.

With the specifications described unsymmetrical bipolar transistors having a current gain of about 20 to 30 or more located in a circuit with a shunt impedance of a modestly low value of at least about 1,000–2,000 ohms generally pass the gain test in only one of the six possible positions of the test switch 18. This same transistor under the high drive test will generally test satisfactorily in two of the six possible positions of the test switch 18 when the transistor is heavily shunted with resistances of the order of magnitude of about 10 to 200 ohms, a transistor having a gain of at least about from 20 to 30 will pass the high drive test in only one position of the test switch.

As previously indicated, by having a test apparatus which provides for low and high drive tests as described, not only does this aid the serviceman in identifying all of the terminals of the transistor when carrying out the low drive test for most satisfactorily operating transistors, but, more importantly, it enables the serviceman to detect marginally operating transistors which would pass a high drive test designed to test transistors in very low shunting impedance circuits, but which would fail a low drive test because of excessive leakage or other reasons. Moreover, the present invention greatly simplifies the carrying out of materials and leakage tests to determine whether a transistor which passes a high drive test but fails a low drive test is defective or marginal rather than being satisfactory but operating in a very low shunting impedance circuit.

It should be understood that numerous modification may be made in the most preferred forms of the invention described without deviating from the broader aspects of the invention.

I claim:

1. Apparatus for testing the current gain of transistors or the like, said apparatus comprising test device connecting terminals to be connected to the respective terminals of a transistor device or the like to be tested in-circuit or out-of-circuit; an intermittently occurring, load terminal energizing voltage source means; an intermittently occurring, control terminal driving voltage source means; said voltage sources when applied to the proper load and control terminals of transistor devices or the like producing load current transitions indicative of the current gain thereof; means for selectively providing relatively high and low drive levels from the proper connection of said voltage source means to the load and control terminals of the transistor device or the like being tested said low drive level providing a load current transition of at least a given level for transistor devices having a forward current gain only above a given minimum value when the device is in a circuit having a shunting impedance of a given value but fails to provide a load current transition of said given level when said circuit has a very low shunting impedance of a fraction of said value, said high drive level providing a load current transition of at least said given level for most transistor devices having a current gain of at least about said value when the transistor devices or the like are in a circuit providing said very low shunting impedance; and current gain detecting means for detecting and indicating the occurrence of a load current transition of at least said given level.

2. The testing apparatus of claim 1 which includes switching means for switching said voltage source means to said test device connecting terminals in the various different possible connecting combinations thereof; said means for detecting said current transitions including means for selectively determining whether the device being tested is of one or opposite conductivity type; function control switching means having a gain test effecting condition for connecting said voltage source means to said device connecting terminals for performing said gain test; a leakage test circuit; a meter movement for said leakage test circuit; leakage test circuit voltage source means for supplying a DC voltage of a fixed value but of selectable polarity; said function control switch having a device leakage test effecting condition for connecting said leakage test circuit and test circuit voltage source to said device connecting terminals extending to the control and load terminals of the device being tested through which a leakage current is to be measured; said current gain detecting means including means for determining the conductivity type of the transistor device or the like under test which shows a satisfactory gain and for effecting a DC output of said test current voltage source means of a polarity corresponding to the conductivity type of the transistor device or the like under test showing such a satisfactory gain.

3. The testing apparatus of claim 2 wherein load terminal energizing and control terminal driving voltage source means generate cyclically repeating pulsed waveforms, said current gain detecting means is operable each cycle of said periodic waveforms and includes resettable memory means settable to a condition indicating a satisfactory gain of the transistor device or the like under test, and means for resetting said memory means each cycle of said periodic waveforms.

4. The testing apparatus of claim 3 wherein the operation of said function control switching means to said leakage test effecting condition disables the operation of said resetting means.

5. The testing apparatus of claim 1 wherein said intermittently occurring voltages generated by said voltage sources have cyclically repeating waveforms comprising current generating pulses which occur only a very minor portion of each test cycle.

6. Apparatus for testing the current gain of transistors or the like, said apparatus comprising test device connecting terminals to be connected to the respective terminals of a transistor device or the like to be tested in-circuit or out-of-circuit; an intermittently occurring, load terminal energizing constant current voltage source, and intermittently occurring control terminal driving constant current voltage source, said voltage sources when applied to the proper load and control terminals of transistor devices or the like producing load current transitions indicative of the current gain thereof; means for selectively providing relatively high and low constant current drive levels from the proper connection of said voltage sources to the load and control terminals of the transistor device or the like being tested, said low drive level providing a load current transition of at least a given level for most unsymmetrical bipolar transistor devices having a forward current gain only above a given acceptable value when the device is in a circuit having a shunting impedance of not much less than a given modestly low value, but providing a load current transition below said given level when load current flow is in a reverse direction for most unsymmetrical bipolar transistors, said high drive level providing a load current transition of at least said given level for most unsymmetrical bipolar transistor devices having a forward current gain of at least said given value when the transistor devices or the like are in a circuit providing a very low shunting impedance of only a small fraction of said modestly low value, and providing said load current transition of at least said given level in both directions of current flow when said unsymmetrical bipolar transistor devices are in a circuit providing a shunting impedance of said modestly low value; and current gain detecting means for detecting and indicating the occurrence of a load current transition of at least said given level.

7. The testing apparatus of claim 6 wherein said minimum gain value of said non-bipolar transistors is in the range of from about 20 to 30.

8. The testing apparatus of claim 6 wherein said shunting impedance of said modestly low value is in the range of from about 1,000 to 2,000 ohms.

9. The testing apparatus of claim 6 wherein said minimum gain value is in the range of about 20 to 30, said shunting impedance of said modestly low value is in the range of about 1,000 to 2,000 ohms, and said very low shunting impedance is in the range of from about 10 to 200 ohms.

10. A circuit for testing transistor devices or the like, said circuit comprising test device connection terminals to be connected at random, if desired, to the respective terminals of a transistor device or the like to be tested in-circuit or out-of-circuit; a periodic, intermittently occurring, control terminal driving, constant current voltage source which voltage, during first and second test intervals, has an initial portion which renders non-conductive a transistor device having a different conductivity type assigned to the test interval involved and which then switches to a polarity and a value which render this transistor device substantially conductive when said load terminal energizing voltage source and said control terminal driving voltage source are connected respectively to the proper load and control terminals of the transistor device or the like being tested; means for switching said voltage sources to said test device connecting terminals in the various different possible connecting combinations thereof; means for selectively providing relatively high and low constant current drive levels from the proper connection of said voltage sources to the load and control terminals of the transistor device or the like being tested, said low drive level providing a load current transition of at least a given level for most non-bipolar transistor devices having a forward current gain only above a given minimum low value when the device is in a circuit having a shunting impedance not much less than a given value, but providing a load current transition below said given level when a load current flow is in a reverse direction for most unsymmetrical bipolar transistors, said high drive level providing a load current transistion of at least said given level for most unsymmetrical bipolar transistor devices having a forward current gain of at least about said low value when the transistor devices or the like are in a circuit providing a very low shunting impedance of only a fraction of said given value; first circuit means for detecting, storing and indicating the occurrence of a load current transition in the transistor device or the like being tested of one conductivity type and properly connected to said load and control terminal voltage sources of at least said given level only during said first test interval; and second circuit means for detecting, storing and indicating the occurrence of a load current transition in the transistor device being tested of the opposite conductivity type and properly connected to said load terminal energizing and control terminal driving voltage sources of at least said given level only during each second test interval.

11. The testing circuit of claim 10 wherein there is provided connecting leads having distinguishing indicia thereon extending from said device connecting terminals; lead connection indicating means including means responsive to said switching means for identifying the terminals of the transistor device or the like to which said connecting leads extend when said switching means connect said sources of voltage to the proper load and control terminals which result in said detecting means detecting a transistor device or the like with a load current transition of at least said given level.

12. The testing circuit of claim 10 wherein there is provided a leakage testing circuit; test voltage supply means for said leakage testing circuit and which is operable to produce an output DC voltage of a given reference value but of selectable opposite polarities; polarity control means responsive to said circuit means for operating said test supply voltage means to produce a test voltage of a polarity corresponding to the conductivity type of the device passing the gain test; function control switch switching means in which a first condition effects connection of the terminals of the transistor device or the like under test and the output of said test voltage supply means to said leakage testing circuit; said function control switching means having a second condition which connects said voltage sources to the terminals of the transistor device under test to perform said gain test; and manually operable means for operating said function control switch means between said first and second conditions.

13. A circuit for testing transistor or FET devices, said circuit comprising test device connection terminals to be connected at random, if desired, to the respective terminals of a transistor device or the like to be tested in-circuit or out-of-circuit; a periodic, intermittently occurring, control terminal driving, constant current voltage source which voltage, during first and second test intervals for testing transistor or FET devices of opposite conductivity type, has during each interval an initial portion of a polarity which renders non-conductive a transistor or FET device having the conductivity type assigned to the test interval involved and which voltage during each such interval switches to the opposite polarity and a value which render this device substantially conductive when said load terminal energizing voltage source and said control terminal driving voltage source are connected respectively to the proper load and control terminals of the transistor or FET device being tested; means for switching said voltage sources to said test device connecting terminals in the various different possible connecting combinations thereof; first circuit means for detecting, storing and indicating the occurrence of a load current transition in the transistor or FET device being tested of one conductivity type and properly connected to said load and control terminal voltage sources of at least a given level only during said first test interval; and second circuit means for detecting, storing and indicating the occurrence of a load current transition in the transistor of FET device being tested of opposite conductivity type and properly connected to said load terminal energizing and control terminal driving voltage sources of at least said given level only during each second test interval.

14. The testing circuit of claim 13 wherein, said first and second test intervals are contiguous and the waveform of the voltage generated by said control terminal driving voltage source is of a constant polarity and value after the initial portion of said first test interval and during said initial portion of said second test interval.

15. Apparatus for testing the current gain of transistors or the like, said apparatus comprising test device connecting terminals to be connected to the respective terminals of a transistor device or the like to be tested in-circuit or out-of-circuit; a load terminal energizing voltage source; a control terminal driving voltage source; said voltage sources when applied to the proper load and control terminals of transistor devices or the like producing load current transistions indicative of the current gain thereof; manually operable switching means for switching said voltage sources to said test device connecting terminals in the various different possible connecting combinations thereof; current gain detecting means for detecting and indicating the occurrence of a load current transition of at least a given level indicating that the device has a satisfactory gain, said detecting means including means for selectively determining whether the device being tested is of one or opposite conductivity type; function control switching means having a gain test effecting condition for interconnecting said voltage sources, device connecting terminals and detecting means for performing a current gain test; a leakage test circuit; a leakage test circuit voltage source supplying a DC voltage of a fixed value but a selectable polarity; said function control switching means having a device leakage test effecting condition for connecting said leakage test circuit and test circuit voltage source to said device connecting terminals extending to the control and load terminals of the device being tested through which a leakage current is to be measured; and said current gain detecting means including means for determining the conductivity type of the transistor device or the like under test and for effecting a DC output of said test current voltage source of a polarity corresponding to the conductivity type of the transistor device or the like under test.

16. The testing apparatus of claim 15 where said load terminal energizing and control terminal driving voltage sources generate cyclically repeating pulsed waveforms, said current gain detecting means is operable each cycle of said periodic waveforms and includes resettable memory means settable to a condition indicating a satisfactory gain of the transistor device or the like under test, and means for resetting said memory means each cycle of said periodic waveforms.

17. The testing apparatus of claim 16 wherein the operation of said function control switching means to said leakage test effecting condition disables the operation of said resetting means.

18. The testing apparatus of claim 15 wherein said intermittently occurring voltages generated by said voltage sources have cyclically repeating waveforms comprising current generating pulses which occur only a very minor portion of each test cycle.

* * * * *